(12) United States Patent
Asnaashari (10) Patent No.: US 9,087,562 B2
(45) Date of Patent: *Jul. 21, 2015

(54) NON-VOLATILE STORAGE MODULE HAVING MAGNETIC RANDOM ACCESS MEMORY (MRAM) WITH A BUFFER WINDOW

(71) Applicant: Avalanche Technology, Inc., Fremont, CA (US)

(72) Inventor: Mehdi Asnaashari, Danville, CA (US)

(73) Assignee: AVALANCHE TECHNOLOGY, INC., Fremont, CA (US)

( * ) Notice: Subject to any disclaimer, the term of this patent is extended or adjusted under 35 U.S.C. 154(b) by 17 days.

This patent is subject to a terminal disclaimer.

(21) Appl. No.: 14/270,248

(22) Filed: May 5, 2014

(65) Prior Publication Data

US 2014/0258604 A1 Sep. 11, 2014

Related U.S. Application Data

(63) Continuation of application No. 13/958,207, filed on Aug. 2, 2013, now Pat. No. 8,719,492, which is a continuation of application No. 13/791,452, filed on Mar. 8, 2013, now Pat. No. 8,595,427.

(51) Int. Cl.
*G11C 7/10* (2006.01)
*G06F 12/06* (2006.01)

(52) U.S. Cl.
CPC .......... *G11C 7/1072* (2013.01); *G06F 12/0638* (2013.01)

(58) Field of Classification Search
None
See application file for complete search history.

(56) References Cited

U.S. PATENT DOCUMENTS

2008/0288741 A1* 11/2008 Lee et al. .................. 711/200
2013/0145113 A1* 6/2013 Paperin et al. ............. 711/163
2013/0205076 A1* 8/2013 Schuette et al. ........... 711/103

* cited by examiner

*Primary Examiner* — Mardochee Chery
(74) *Attorney, Agent, or Firm* — Maryam Imam; IPxLAW Group LLP (57) ABSTRACT

A block storage system includes a host and comprises a block storage module that is coupled to the host. The block storage module includes a MRAM array and a bridge controller buffer coupled to communicate with the MRAM array. The MRAM array includes a buffer widow that is moveable within the MRAM array to allow contents of the MRAM array to be read by the host through the bridge controller buffer even when the capacity of the bridge controller buffer is less than the size of the data being read from the MRAM array.

28 Claims, 5 Drawing Sheets

NON-VOLATILE STORAGE MODULE HAVING MAGNETIC RANDOM ACCESS MEMORY (MRAM) WITH A BUFFER WINDOW

CROSS REFERENCE TO RELATED APPLICATIONS

This application is a continuation of U.S. patent application Ser. No. 13/958,207, filed on Aug. 2, 2013, by Mehdi Asnaashari, and entitled "Non-Volatile Block Storage Module Using Magnetic Random Access Memory (MRAM), which is a continuation of U.S. patent application Ser. No. 13/791,452, filed on Mar. 8, 2013, by Mehdi Asnaashari, and entitled "Non-Volatile Block Storage Module Using Magnetic Random Access Memory (MRAM).

BACKGROUND OF THE INVENTION

1. Field of the Invention

This invention relates generally to a storage medium and more particularly to a method and apparatus for accessing the same.

2. Description of the Prior Art

Magnetic memory, such as magnetic random access memory (MRAM), shows exciting potential as the future's favorite memory in a wide variety of applications. This is arguably mostly attributable to manufacturing limitations faced by currently-popular memory, such as dynamic random access memory (DRAM) and static random access memory (SRAM). Such limitations include volatility of these memories. These devices will only hold their contents while power is being applied and loss their contents when power is removed. For example, current applications of non-volatile dual in-line memory module (NVDIMM) in the marketplace incorporate DRAM in addition to some sort of backup system such as batteries, super capacitors or a network of Tantalum caps, a PLD, power monitoring system, and non-volatile backup media such as NAND. During a system power interruption, the power monitoring system detects the interruption and directs the PLD to backup content of the DRAM devices onto an on-board Flash, such as NAND. When power is restored, the contents of the Flash are transferred back into the DRAM with no loss of critical data. This is obviously inconveniently time-intensive. One of the typical applications of such devices is a very high performance low latency block storage device closely coupled to the CPU in servers and blades.

Limitations are also faced by other types of widely-employed memory, such as flash memory. Such limitations include long write or program times and memory management expenses in that the memory must first be erased before being re-programmed which will not make them suitable for these high performance applications. In summary, the current implementation is costly, not green, requires backup to non-volatile (NV) media during power interruption and restoration on subsequent power up.

The foregoing limitations, in addition to others known in the industry, has prompted using MRAM as an alternative form of storage of information. In fact, MRAM is widely expected to replace traditional memory in the near future. However, replacing memory such as DRAM or SRAM or even flash with MRAM, presents its own set of problems, one of which is meeting requisite timing requirements in a system using traditional memory. In other words, simply replacing traditional memory with MRAM cannot be done in a plug-and-play setting because MRAM is quite different and therefore has its own set of requirements. For example, the host (or central processing unit (CPU)) in a computer or storage system employing MRAM cannot readily access the MRAM.

Thus, there is a need for a high performance host-based system employing MRAM with reduced latency

SUMMARY OF THE INVENTION

Briefly, a method and apparatus for accessing a storage media employed to store data from a host includes identifying a module as a non-volatile block storage device. The block storage device is coupled to a host and includes a bridge controller and magnetic random access memory (MRAM). The MRAM has a buffer window for storing data from a host, the buffer window is movable throughout the MRAM. The buffer window is defined as a region of the MRAM array employed by the bridge controller to read data from or to write data to at any given time. The bridge controller has a bridge controller buffer and controller registers. Size of the buffer window is determined, at least in part, by the size of the buffer in the bridge controller. A request to access the block storage device is intercepted and a command to the block storage device is issued. If the command is a write command, at least a portion of the data to be saved into the MRAM is transferred to the bridge controller buffer. The size of the at least a portion of the data is based on the capacity of the bridge controller buffer. Further, at least a portion of the data to the buffer window is transferred and upon having additional data to be saved into the MRAM, the buffer window is moved within the MRAM. Another portion of the data is transferred to the bridge controller buffer and from the bridge controller buffer is transferred to the moved buffer window and the moving the buffer window and the transferring data steps are repeated until the data is transferred, in its entirety, from the host to the MRAM.

These and other objects and advantages of the invention will no doubt become apparent to those skilled in the art after having read the following detailed description of the various embodiments illustrated in the several figures of the drawing.

DETAILED DESCRIPTION OF THE VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the invention. It should be noted that the figures discussed herein are not drawn to scale and thicknesses of lines are not indicative of actual sizes.

In an embodiment of the invention, a method and apparatus for accessing a storage media employed to store data from a host includes identifying a module as a block storage device. The block storage device is coupled to a host and includes a bridge controller and magnetic random access memory (MRAM). The MRAM has a buffer window for storing data from a host, the buffer window is movable throughout the MRAM. The buffer window is defined as a region of the MRAM array that the bridge controller uses to read data from or to write data to at any given time. The bridge controller has a bridge controller buffer and controller registers. Size of the buffer window is similar to and in some embodiments defined by the size of the buffer in the bridge controller. A request to access the block storage device is intercepted and a command to the block storage device is issued. If the command is a write command, at least a portion of the data to be saved into the MRAM is saved. The size of the at least a portion of the data is based on the capacity of the bridge controller buffer. Further, at least a portion of the data to the buffer window is transferred and upon having additional data to be saved into the MRAM, the buffer window is moved within the MRAM. Another portion of the data from the bridge controller buffer is transferred to the moved buffer window and the moving the buffer window and the transferring data steps are repeated until the data is transferred, in its entirety, from the host to the MRAM.

Figure 1:
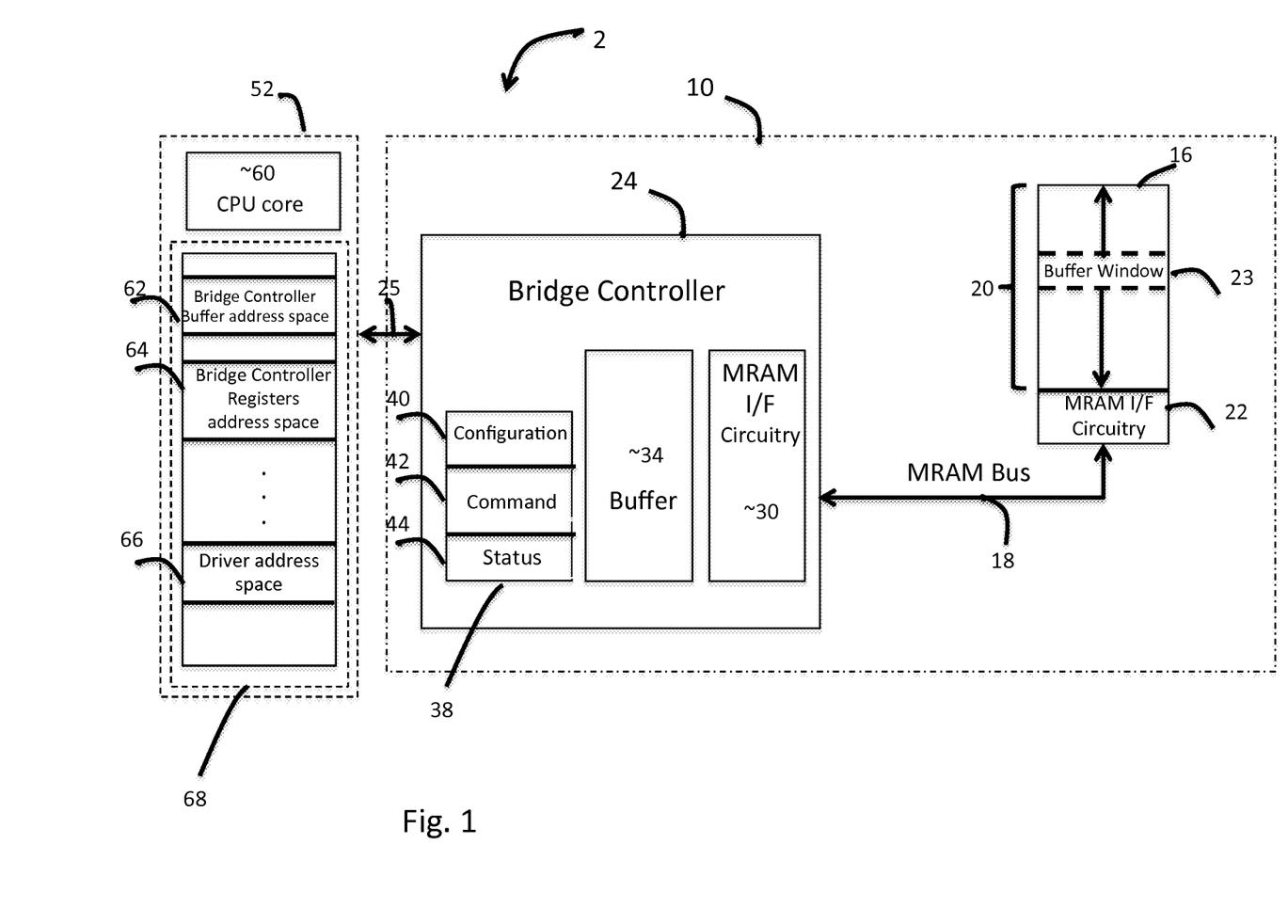
FIG. 1 shows a block diagram of a block storage module, in accordance with an embodiment of the invention.

Referring now to FIG. 1, a block diagram of a block storage system 2 is shown, in accordance with an embodiment of the invention. The storage system 2 is shown to include a central processing unit (CPU) 52 and a block storage module 10. The CPU 52, which is also referred to herein as a "host" or "microprocessor", sends commands and transfers data through a CPU bus 25, coupling the CPU 52 to the module 10. Data that is transferred between the CPU 52 and the module 10 is either stored in the module 10 or read from the module 10.

The module 10 is shown to include a bridge controller 24 and a magnetic random access memory (MRAM) device 16. The bridge controller 24 is shown to include controller registers 38, which are in turn shown to include configuration registers 40, command registers 42, and status registers 44. The bridge controller 24 is shown to further include a bridge controller buffer 34, and a MRAM interface circuitry 30. The MRAM device 16 is shown to include MRAM array 20 and a MRAM interface circuitry 22, the MRAM interface circuitry 22 shown coupled through a MRAM bus 18, to the bridge controller 24. A buffer window 23 in the MRAM array 20 moves throughout the MRAM array 20 during some of the times data is being written to or being read from the MRAM array 12, as will become evident shortly.

The CPU 52 is shown to include a CPU core 60 and CPU address space 68 from which the CPU can execute codes (or programs). The CPU address space 68 is shown in relevant part to include a bridge controller buffer address space 62, a bridge controller registers address space 64, and a driver address space 66. As is known in the art, address spaces, such as address space 62, 64, and 66 each identify the location where respective data is saved. For example, the address space 66 identifies a location within memory where the driver is saved.

The address space 62 advantageously provides access to the MRAM array 20 through the bridge controller buffer 34. In the embodiment of FIG. 1, bridge controller buffer 34 is mapped into the address space 62 of the CPU 52 allowing the CPU 52 access to the array 20 through the bridge controller buffer 34. A driver being executed from a driver portion of the address space 68 facilitates the transfer of data from a memory such as DRAM or SRAM mapped to a CPU portion of the address space 68 to the bridge controller buffer 34.

Each of the address spaces 62, 64, and 66 identify an area within the CPU portion of the address space 68 in which a physical memory device, such as DRAM or SRAM, is located. For example, the space 62 identifies the address space that CPU 52 uses to access the buffer 34 to read data from or to write data to. Similarly, controller registers 38 of the controller 24 are mapped to the CPU portion of the address space 64 and the driver that directs writing into or reading from the module 10 by accessing the controller registers and buffer through their associated addresses. The driver typically resides in a memory such as DRAM or SRAM and is mapped to the CPU portion of the address space 66. The controller registers are typically implemented in ASIC and are mapped to CPU portion of the address space 64 and buffer are typically a memory such as DRAM or SRAM and is mapped to the CPU portion of the address space 62.

The configuration registers 40 are used by the driver to direct the bridge controller 24 to certain locations and memory sizes, such as in an exemplary embodiment the location and size of the MRAM array in which data is being written or from which data is being read. The command registers 42 are used by the driver to direct the bridge controller 24 to certain operations, such as in some embodiments, to read from or to write to the MRAM array. In some embodiments, the status registers 44 indicates the status of the command in progress such as if the command has completed successfully or the command remains in progress. The circuitry 30 is an interface through which the controller 24 communicates with the MRAM device 16 via the MRAM bus 18. That is, the data that is written to the controller registers 38 and the buffer 34 by the driver go through the circuitry 30 to couple information through the MRAM bus 18 to the MRAM devices 16. Similarly, data that is being read from the MRAM device go through the circuitry 30 via the MRAM bus 18 to the controller buffer 34.

The MRAM interface circuitry 22, analogously to the circuitry 30, causes communication between the MRAM array 12 and the controller 24 and further controls writing and reading of data to and from the MRAM 20 and includes circuits such as row and column decoders.

The CPU 52, in some embodiments, is an ARM, an ARC, or any Intel X86.

In operation, during a write operation, initiated by an application and under the direction of the driver, executed by the CPU core 60 from memory mapped to the driver address space 66, a module, to be written to, is identified as the module 10. A request initiated by the application to access the module 10 is intercepted by the driver. Next, a command is issued by the driver to the controller registers 38 of the module 10. The command identifies the block address (either physical or logical) and size of the data corresponding to the request. In some embodiment, the driver may send one command to the module 10 corresponding to the request or in some other embodiment, the driver may break the request into multiple commands Assuming the command is a write command, at least a portion of the data to be saved into the MRAM array 20 is sent directly by the CPU 52 under direction of the driver through the CPU bus 25 and saved in the buffer 34. The size of the portion of data being saved in the buffer 34 is based on the capacity or size of the buffer 34. Next, the data that is saved in the buffer 34 is transferred; under the direction of the bridge controller 24 to the buffer window 23 of the MRAM array 20 through the circuitry 30 via MRAM bus 18. The starting location of the buffer window is set by the bridge controller 24 based on the data in the configuration registers 40 written by the driver and size of the buffer window is determined by size the buffer 34. If the data is larger than the size of the buffer 34, the remainder or at least a part of the remainder, as the case may be in accordance with the size of the buffer 34, the buffer window 23 is moved up and/or down the MRAM 20 identifying another area of the MRAM 20 in which the contents of the buffer 34 are saved. This process is repeated until all of the data that is intended to be saved is transferred into the MRAM array 20. In this respect, data is saved in the MRAM array 20 in a manner analogous to saving data into a DRAM, from the perspective of the CPU core 60, with the exception that saving of data is performed on a piece-mill basis with the size of each piece being dependent on the configuration of the controller buffer 34. Further, the controller buffer 34 and the controller registers 38 are directly coupled to the CPU 52 and they are therefore directly accessible by the CPU 52 without going through another interface or translation.

It is noted that the system 2 is regarded as an embedded application of the module 10 where the CPU bus 25 is exposed and accessible by an external device, such as a graphics card, memory controller, RAM, PCIA controller, or any other requisite device that meets the timing requirements of the CPU bus 25. In some of the figures to follow, such as FIG. 3, a non-embedded application of a system 4 is shown and described with the CPU bus 25 no longer being exposed, whereas other busses, such as a memory bus 26 is exposed.

Figure 2:
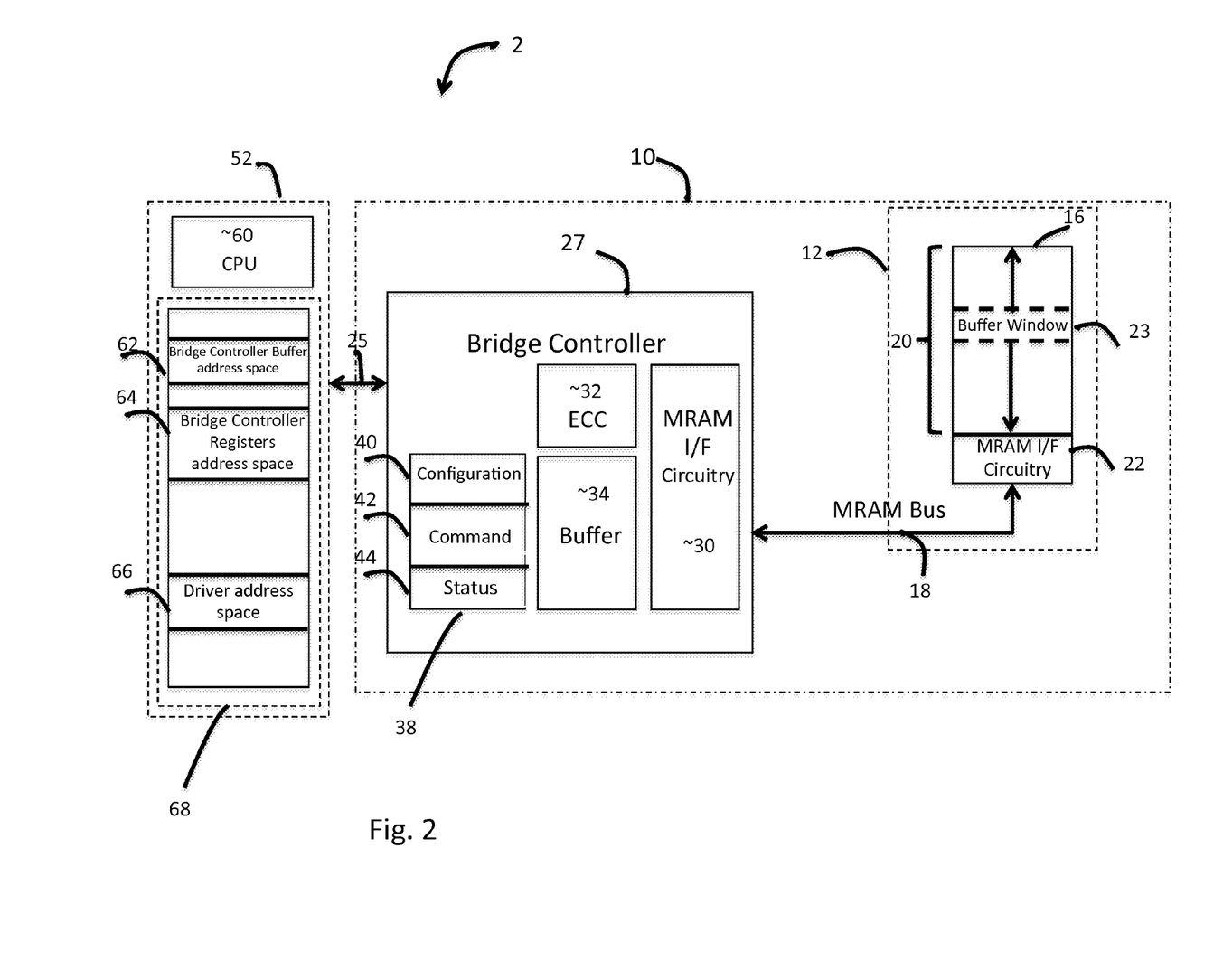
FIG. 2 shows a block diagram of a block storage module, in accordance with another embodiment of the invention.

FIG. 2 shows a block diagram of a block storage system, in accordance with another embodiment of the invention. In particular the module 10 includes a bridge controller 27 rather than the bridge controller 24 of the embodiment of FIG. 1. The bridge controller 27 is analogous to the bridge controller 24 except that it includes an error coding and correction (ECC) 32. The ECC 32 encodes data in the buffer 34 that is to be saved in the MRAM 20, prior to being saved therein, and decodes and at times corrects data that is to read from the MRAM 20. Examples of ECC are cyclic error-correcting codes such as BCH or Hamming code single error correction, and double error detection (SECDED).

Figure 3:
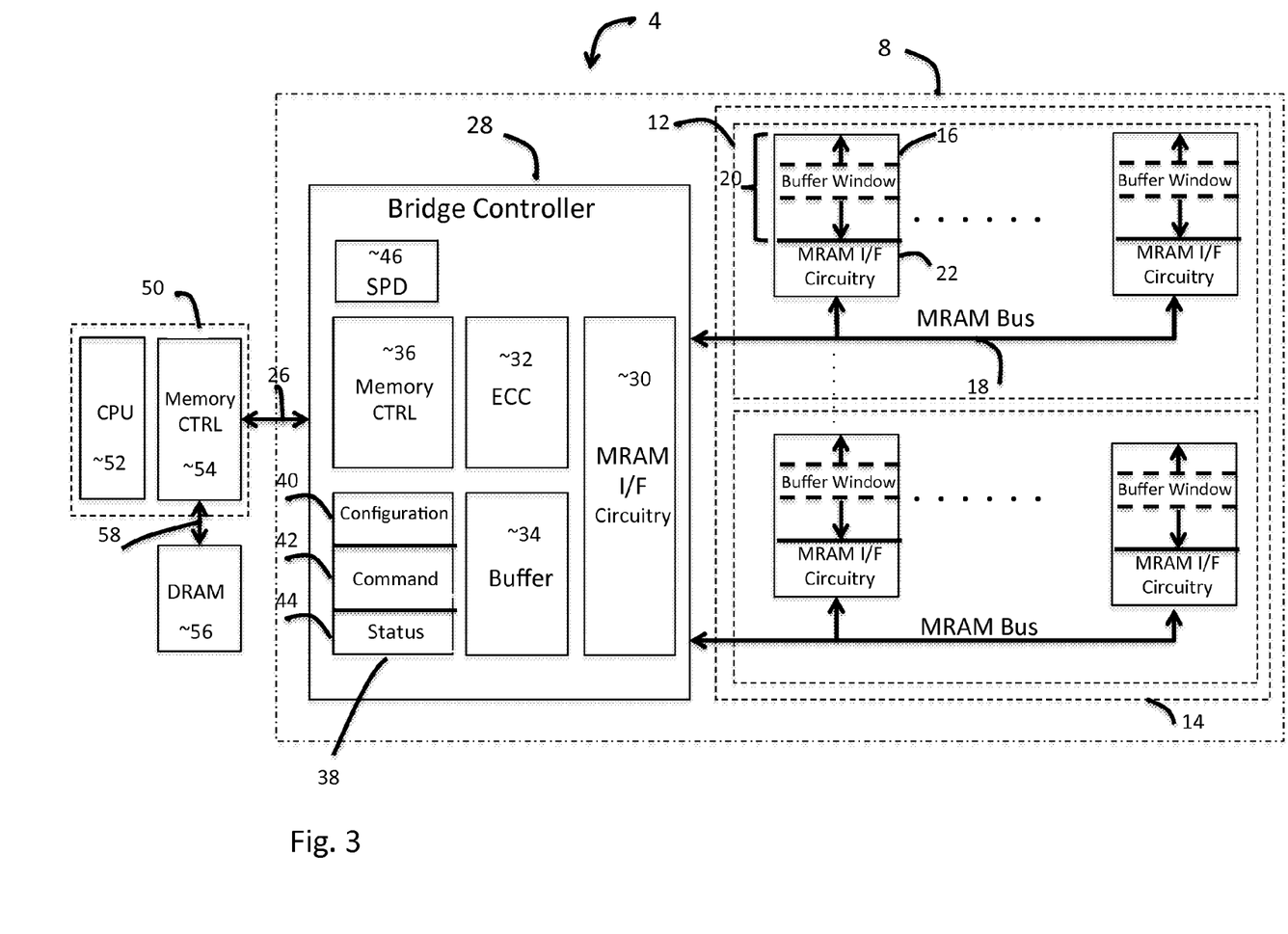
FIG. 3 shows a block diagram of a block storage module, in accordance with yet another embodiment of the invention.

FIG. 3 shows a block diagram of a block storage system 4, in accordance with another embodiment of the invention. The system 4 is analogous to the system 2 of FIGS. 1 and 2 with the following exceptions. The CPU subsystem 50 is shown to include a memory controller 54 in addition to the CPU 52. Additionally, the block storage module 10 of FIGS. 1 and 2 is replaced with the block storage module 8, in FIG. 3. The module 8 is shown to include a bridge controller 28 rather than the bridge controller 27 of the embodiment of FIG. 2 and that of FIG. 1. The bridge controller 28 is analogous to the bridge controller 27 except that it includes a bridge controller memory controller 36 to allow the module 8 to be in direct communication with the CPU subsystem 50 through the memory bus 26. In the embodiment of FIG. 3, the controller registers 38 and the buffer 34 are in direct communication with the memory controller 54 and not the CPU 52, the latter being the case in the embodiments of FIGS. 1 and 2. In FIG. 3, the memory controller 54 is shown coupled to the CPU 52 in the CPU subsystem 50 and it serves to receive stream of read and write commands from CPU 52 and converting them to DDR protocol as well as scheduling specific tasks required for DRAM or SDRAM proper operations such as precharge, bank activate, and refresh commands to optimize the memory bus.

In the embodiment of FIG. 3, all accesses by the CPU 52 to the configuration registers 38 and the buffer 34, under direction of the driver, are directed to the memory controller 54 and the memory controller 54 directly accesses the controller registers 38 and the buffer 34 through the memory bus 26 and the memory controller 36.

Another notable difference between the system 4 of FIG. 3 and the system 2 of FIG. 1 is the block storage media 14, in FIG. 3, which is shown coupled to the bridge controller 28 through the MRAM interfaces 18 in that the media 14 is shown to include a number of MRAM devices 16, each of which is shown to include the array 20 and a MRAM interface circuitry 22. It is understood that while not shown, the MRAM array 12 of FIG. 1 may include more than one MRAM devices 16.

The embodiment of FIG. 3 is shown to include a DRAM 56 coupled to the memory controller 56 of the CPU subsystem 50 via DRAM bus 58. The DRAM 56 is located externally to the block storage module 8 and the CPU subsystem 50. In other embodiments, the DRAM 56 may be internal to the CPU subsystem 50 In some embodiment of the invention, the DRAM 56 is mapped to a DRAM controller address space within the CPU address space 68, The DRAM 56 is used by the CPU 52, under direction of the driver, discussed hereinabove, to store data that is read from the buffer 34 or to retrieve data to be written to the buffer 34.

In some embodiments, the DRAM 56 may include the driver that is mapped to the CPU address space 66. Bridge controller buffer address space 62 and configuration registers address space 64 are also mapped to DRAM controller address space within the CPU addresses space 68.

The memory bus 26 and DRAM bus 58 in some embodiment are DDR2, DDR3, DDR4, LPDDR2 or LPDDR3 compliant and the memory controller 54 and 36 are similarly DDR2, DDR3, DDR4, LPDDR2 or LPDDR3 types of controllers.

FIG. 3 further shows a serial presence detect (SPD) circuitry 46 which is used by the CPU 52 to read the configuration information of the module 10, such as timing parameters and the manufacturer's information, during power-up, and to initialize the memory controller 54 accordingly. The content of the SPD circuitry 46 may reside in a private portion of one of the MRAM devices, such as the device 16. In some embodiment of the invention, multiple copies of the content of the SPD circuitry 46 may be a part of one or more of the MRAM devices in the case where the primary copy is corrupted.

Figure 4:
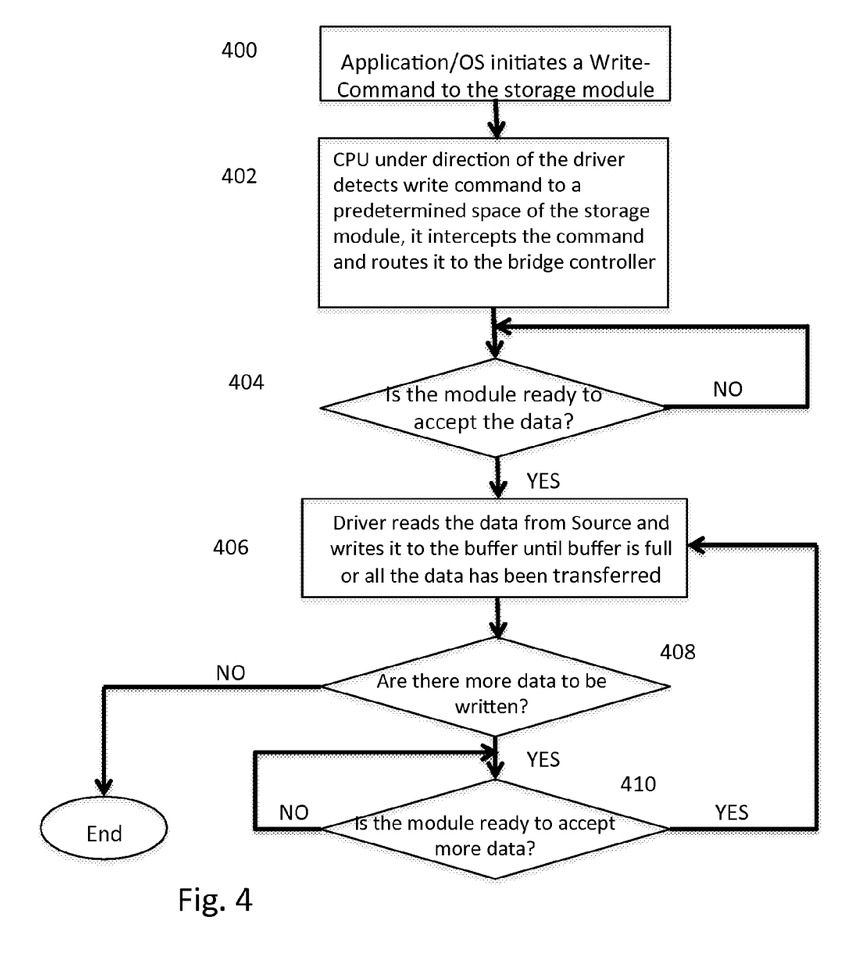
FIG. 4 shows a flow chart of write operation, in accordance with yet another embodiment of the invention.

In some embodiment, where the SPD circuitry 46 has reserved bytes, the reserved bytes may be used to communicate block storage characteristics, such as capacity, maximum number of logical block address (LBA), size of the buffer 34, and number of the buffers 34 to the CPU 52, under direction of the driver, during the power-up sequence. In such embodiments, the driver uses some of the reserved byte information to notify the host (or CPU 52) of the presence of such a block storage device and some other bytes to efficiently schedule read and write commands to the module FIG. 4 shows a flow chart of write operation, in accordance with a method of the invention, the steps of which are performed by a block storage system of an embodiment of the invention, such as the system 2. System 2 is used as an example to explain the steps of FIGS. 4 and 5. In FIG. 4, at step 400, an application initiates a write operation to the non-volatile block storage module 10. Next, at step 402, CPU 52 under direction of the driver residing in the space 66 of the CPU 52, detects the write command of step 400, which is a write to a predetermined space of the storage module 10. The driver intercepts the write command and routes it to the controller 24 by writing to the controller registers 38.

Next, at 404, a determination is made as to whether or not the storage module 10 is ready to accept the data that is to be written from the CPU 52 and if not, the process waits at 404, otherwise, the process continues to step 406. At step 406, the CPU 52 reads the data from a predetermined address of the address space 68 and writes it directly to the buffer 34 by writing to the address space 62 until either the buffer 34 becomes full or all of the data that is to be written has been transferred to the buffer 34.

Next, at 408, a determination is made as to whether or not there is more data to be written and if not, the process ends, otherwise, the process continues to 410 where another determination is made. At 410, a determination is made as to whether or not the module 10 is ready to accept additional data and if not, the process waits until the module 10 has completed the transfer of the data from the buffer 34 to the MRAM array 20 buffer window 23 and is ready to accept additional data, otherwise, the process continues to the step 406 and repeats as discussed above. It is noted that the operating system or an application initiates the write operation to the module 10 in step 400 and then the CPU 52 under direction of driver performs rest of the steps and determinations of the process of FIG. 4.

Figure 5:
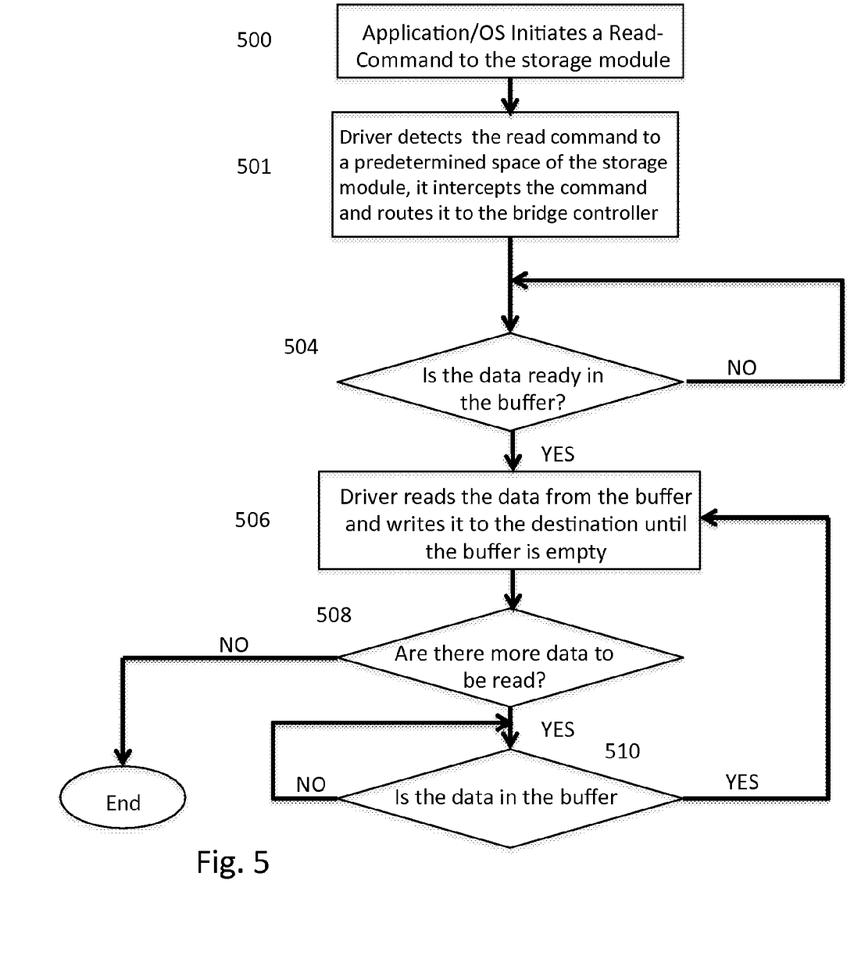
FIG. 5 shows a flow chart of read operation, in accordance with yet another embodiment of the invention.

FIG. 5 shows a flow chart of a read operation, in accordance with a method of the invention, the steps of which are performed by a block storage system of an embodiment of the invention, such as the system 2. At step 500, the application or OS initiates a read command to the non-volatile block storage module 10. Next, at step 501, the CPU 52 under direction of the driver detects the read command to a predetermined space of the storage module 10. The driver intercepts the read command and routes it to the controller 24 by writing to the controller registers 38.

Next, at 504, a determination is made by the driver as to whether or not the data that is to be read from the storage media 12 is ready in the buffer 34 by reading the status register 44. If data is not ready in the buffer, the process waits until such time as when the data is ready, otherwise, the process continues to step 506. At step 506, the CPU 52 under direction of the driver reads the data directly from the buffer 34 and writes the read data to a destination address space until the buffer 34 is empty or all data has been read. Next, at 508, a determination is made as to whether or not additional data is to be read and if not, the process ends, otherwise, the process continues to 510 where another determination is made as to whether or not data remains in the buffer 34 and if not, the process waits until there is additional data and if not, the process continues to the step 506 and repeats from there. It is noted that the operating system or an application initiates the read operation to the module 10 in step 500 and then the CPU 52 under direction of driver performs rest of the steps and determinations of the process of FIG. 5.

At each of the steps 404, 408, 504, and 508, in FIGS. 4 and 5, a couple of ways of waiting for data may be employed such as polling a status register, such as the register 44, in FIG. 1, or sending an interrupt to the CPU, such as the CPU 52, when data is ready.

It is contemplated that the steps of FIGS. 4 and 5 are analogously performed by the system 4 of FIG. 3.

Due to the characteristics of MRAM devices, DRAM-like performance is realized by the various embodiments of the invention while enjoying the non-volatility attribute of MRAM.

In some embodiments, the bridge controller, such as the controller 24 of FIG. 1, the controller 27 of FIG. 2, or the controller 28 of FIG. 3, each may include multiple bridge controller buffers in which case performance is improved over that of the embodiments of FIGS. 1-3 because data is pipelined.

Although the invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of accessing a storage module comprising:
   responsive to a write command with associated data, from a host, saving at least a portion of the data, intended to be saved in the MRAM array, in a bridge controller buffer, the bridge controller buffer being coupled to the MRAM array and directly coupled to and directly accessible by the host, the MRAM array including a moveable buffer window;
   first transferring the at least a portion of data from the bridge controller buffer to a current location of the buffer window;
   upon having additional data to be saved in the MRAM array, causing changing the location of the buffer window within the MRAM array; and
   second transferring another portion of the data from the bridge controller buffer to the changed location of the buffer window.

2. The method of accessing, as recited in claim 1, wherein the size of the at least a portion of data being based on the capacity of the bridge controller buffer.

3. The method of accessing, as recited in claim 1, further including repeating the second transferring step until the data is transferred, in its entirety, from the host to the MRAM array.

4. The method of accessing, as recited in claim 1, wherein the bridge controller buffer is a part of a bridge controller device that includes configuration registers and the host has direct access to the configuration registers.

5. The method of accessing, as recited in claim 1, wherein the host is a memory controller.

6. The method of accessing, as recited in claim 1, wherein the host is a CPU.

7. The method of accessing, as recited in claim 1, wherein the steps of first transferring and second transferring are performed by a driver.

8. A non-volatile storage module that is configured to communicate with a host comprising:
   a bridge controller including a buffer, the buffer including data; and
   a magnetic random access memory (MRAM) array, the bridge controller being operable to save at least a portion of the data in the buffer into the MRAM array, the buffer being mapped into a host address space of the host and directly coupled to and directly accessible by the host without going through another interface or translation.

9. The non-volatile storage module of claim 8, wherein the MRAM array further having a buffer window, the buffer window being moveable within the MRAM array, the location of the buffer window within the MRAM array identifying the location of the data being saved in the MRAM array.

10. The non-volatile storage module of claim 8, wherein the buffer having a capacity for saving at least portion of host data.

11. The non-volatile storage module of claim 8, wherein the MRAM array is coupled to a first MRAM interface circuitry and the buffer is coupled to a second MRAM interface circuitry.

12. The non-volatile storage module of claim 11, wherein the first MRAM interface circuitry being DDR2, DDR3, DDR4, LPDDR2, LPDDR3, or ONFI compliant.

13. The non-volatile storage module of claim 11, wherein the second MRAM interface circuitry being DDR2, DDR3, DDR4, LPDDR2, or LPDDR3 compliant.

14. The non-volatile storage module of claim 8, wherein the bridge controller further including configuration registers, command registers, and status registers, the configuration registers, command registers, and status registers being directly accessible by the host.

15. The non-volatile storage module of claim 8, wherein the host is a DRAM controller or a CPU.

16. The non-volatile storage module of claim 8, wherein the bridge controller further including an error coding correction (ECC).

17. A bridge controller configured to communicate with a host comprising:
   a buffer including data; and
   a magnetic random access memory (MRAM) array, the bridge controller being operable to save at least a portion of the data in the buffer into the MRAM array, the buffer being mapped into a host address space of a host and directly coupled to and directly accessible by the host without going through another interface or translation.

18. The bridge controller of claim 17, wherein the MRAM array further having a buffer window, the buffer window being moveable within the MRAM array, the location of the buffer window within the MRAM array identifying the location of the data being saved in the MRAM array.

19. The bridge controller of claim 17, wherein the buffer having a capacity for saving at least portion of host data.

20. The bridge controller of claim 17, wherein the MRAM array is coupled to a first MRAM interface circuitry and the buffer is coupled to a second MRAM interface circuitry.

21. The bridge controller of claim 20, wherein the first MRAM interface circuitry being DDR2, DDR3, DDR4, LPDDR2, LPDDR3, or ONFI compliant.

22. The bridge controller of claim 20, wherein the second MRAM interface circuitry being DDR2, DDR3, DDR4, LPDDR2, or LPDDR3 compliant.

23. The bridge controller of claim 17, wherein the bridge controller further including configuration registers, command registers, and status registers, the configuration registers, the command registers, and the status registers being directly accessible by the host.

24. The bridge controller of claim 17, wherein the host is a DRAM controller or a CPU.

25. The bridge controller of claim 17, wherein the bridge controller further including an error coding correction (ECC).

26. A storage system comprising;
   a storage module capable of communicating with a host, the storage module comprising:
   a bridge controller including a buffer, the buffer directly coupled to the host to receive from and send to data;
   at least one magnetic random access memory (MRAM) array, the bridge controller being operable to save at least a portion of the data in the buffer into the MRAM,
   wherein the bridge controller allows the storage module to be in direct communication with the host without going through another interface or translation.

27. The storage system of claim 26, wherein the host is a CPU sub-system and the storage module is coupled to the CPU sub-system through a CPU bus.

28. The storage system of claim 26, wherein the bridge controller further including an error coding correction (ECC).

* * * * *